US009978991B2

(12) United States Patent
Son

(10) Patent No.: US 9,978,991 B2
(45) Date of Patent: May 22, 2018

(54) ORGANIC LIGHT-EMITTING DISPLAY APPARATUS HAVING LIGHT-SCATTERING PARTICLES IN A FILLING MEMBER

(71) Applicant: Samsung Display Co., Ltd., Yongin-si, Gyeonggi-do (KR)

(72) Inventor: Junghyun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 14/986,600

(22) Filed: Dec. 31, 2015

(65) Prior Publication Data
US 2016/0293891 A1 Oct. 6, 2016

(30) Foreign Application Priority Data
Mar. 31, 2015 (KR) .................. 10-2015-0045332

(51) Int. Cl.
*H01L 51/52* (2006.01)
*H01L 51/00* (2006.01)
*H01L 27/32* (2006.01)

(52) U.S. Cl.
CPC ........ *H01L 51/5268* (2013.01); *H01L 51/004* (2013.01); *H01L 51/0094* (2013.01); *H01L 51/5246* (2013.01); *H01L 51/5259* (2013.01); *H01L 27/322* (2013.01); *H01L 27/3244* (2013.01); *H01L 51/5284* (2013.01)

(58) Field of Classification Search
CPC ............. H01L 51/5268; H01L 51/0094; H01L 51/5259; H01L 51/5246; H01L 51/5284; H01L 27/3244; H01L 51/004
See application file for complete search history.

(56) References Cited

U.S. PATENT DOCUMENTS

| 7,531,234 | B2* | 5/2009 | Nakamura | G02B 1/105 |
| | | | | 428/323 |
| 2002/0192476 | A1* | 12/2002 | Kambe | B32B 27/08 |
| | | | | 428/447 |
| 2009/0230841 | A1 | 9/2009 | Boerner | |
| 2011/0024779 | A1* | 2/2011 | Nakamura | B82Y 20/00 |
| | | | | 257/98 |
| 2011/0133213 | A1* | 6/2011 | Lee | H01J 7/183 |
| | | | | 257/79 |
| 2011/0298361 | A1 | 12/2011 | Matsunaga et al. | |
| 2012/0112212 | A1* | 5/2012 | Kim | H01L 51/5246 |
| | | | | 257/88 |

(Continued)

FOREIGN PATENT DOCUMENTS

| KR | 10-2005-0115631 A | 12/2005 |
| KR | 10-2011-0124314 A | 11/2011 |

(Continued)

*Primary Examiner* — Michael Jung
(74) *Attorney, Agent, or Firm* — Lewis Roca Rothgerber Christie LLP

(57) ABSTRACT

An organic light-emitting display apparatus including a display unit on a substrate, an encapsulating substrate facing the substrate and the display unit, a filling member between the display unit and the encapsulating substrate, and light-scattering particles in the filling member wherein a difference between a refractive index of the filling member and a refractive index of the light-scattering particles is within a set range refractive index numbers.

12 Claims, 2 Drawing Sheets

(56) References Cited

U.S. PATENT DOCUMENTS

| | | |
|---|---|---|
| 2012/0133275 A1 | 5/2012 | Lee et al. |
| 2012/0256201 A1 | 10/2012 | Lee et al. |
| 2012/0256218 A1* | 10/2012 | Kwack ................ H01L 51/5256 257/98 |
| 2013/0149803 A1 | 6/2013 | Moon et al. |
| 2013/0168644 A1* | 7/2013 | Park .................... H01L 51/5234 257/40 |
| 2014/0027724 A1* | 1/2014 | Lim .................... H01L 51/5281 257/40 |
| 2014/0036528 A1 | 2/2014 | Kim et al. |
| 2015/0255754 A1* | 9/2015 | Moon ................ H01L 51/5268 257/89 |

FOREIGN PATENT DOCUMENTS

| | | |
|---|---|---|
| KR | 10-2012-0057286 A | 6/2012 |
| KR | 10-2012-0113555 A | 10/2012 |
| KR | 10-2013-0066271 A | 6/2013 |
| KR | 10-2014-0017742 A | 2/2014 |
| KR | 10-2014-0086059 A | 7/2014 |

\* cited by examiner

ORGANIC LIGHT-EMITTING DISPLAY APPARATUS HAVING LIGHT-SCATTERING PARTICLES IN A FILLING MEMBER

CROSS-REFERENCE TO RELATED APPLICATION

This application claims priority to, and the benefit of, Korean Patent Application No. 10-2015-0045332, filed on Mar. 31, 2015, in the Korean Intellectual Property Office, the disclosure of which is incorporated herein in its entirety by reference.

BACKGROUND

1. Field

One or more exemplary embodiments relate to an organic light-emitting display apparatus.

2. Description of the Related Art

Organic light-emitting display apparatuses are self-emitting type display apparatuses including an organic light-emitting diode (OLED) including a hole injection electrode, an electron injection electrode, and an organic emission layer between the hole injection electrode and electron injection electrode, wherein excitons, which are generated by the combination of holes injected from the hole injection electrode and electrons injected from the electron injection electrode in the organic emission layer, emit light by falling from an excited state to a ground state.

Organic light-emitting display apparatuses that are self-emitting type display apparatuses require no additional light sources, and thus, they may be driven by a low voltage, and may be thin and light. Also, organic light-emitting display apparatuses have excellent characteristics, such as wide viewing angles, high contrast, and rapid response rates, which draw attention to the organic light-emitting display apparatuses, as the next generation display apparatuses.

Information disclosed in this Background section was already known to the inventors before achieving the inventive concept or is technical information acquired in the process of achieving the inventive concept. Therefore, it may contain information that does not form prior art that is already known to the public.

SUMMARY

One or more exemplary embodiments include an organic light-emitting display apparatus capable of improving a wide viewing angle, and reducing or minimizing deterioration of luminance, which may be otherwise caused by the improvement of the wide viewing angle.

Additional aspects will be set forth in part, in the description that follows and, in part, will be apparent from the description, or may be learned by practice of the presented embodiments.

According to an aspect of one or more exemplary embodiments, an organic light-emitting display apparatus is described which may include: a substrate; a display unit on the substrate; an encapsulating substrate facing the substrate and the display unit; a filling member between the display unit and the encapsulating substrate; and light-scattering particles in the filling member, wherein a difference between a refractive index of the filling member and a refractive index of the light-scattering particles is about 0.1 to about 0.2.

The filling member may include silicone.

The filling member may include polydimethylsiloxane (PDMS).

The refractive index of the filling member may be about about 1.41 to about 1.54.

The light-scattering particles may include at least one of methyl silicone, phenyl silicone, or polystyrene.

The light-scattering particles may include methyl silicone or phenyl silicone, and the refractive index of the light-scattering particles may be about 1.41 to about 1.54.

The light-scattering particles include polystyrene, and the refractive index of the light-scattering particles may be about 1.58 to about 1.60.

The light-scattering particles may include polystyrene, and a content of the light-scattering particles in the filling member may be about 2 to about 3 wt %.

The refractive index of the light-scattering particles may be about 1.41 to about 1.60.

An average particle diameter (D50) of the light-scattering particles may be about 1.5 μm.

The organic light-emitting display apparatus may include a sealant between the substrate and the encapsulating substrate at an edge thereof, and the sealant may bond the substrate and the encapsulating substrate together.

The organic light-emitting display apparatus include a getter adjacent the sealant for absorbing moisture.

The display unit may include a thin film transistor and an organic light-emitting diode.

The organic light-emitting diode may include a first electrode, a second electrode, and an intermediate layer between the first electrode and the second electrode.

The organic light-emitting display apparatus may include a plurality of color filters on a respective area of the encapsulating substrate corresponding to the intermediate layer.

The organic light-emitting display apparatus include a black matrix between respective color filters of the plurality of color filters for absorbing visible light.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Figure 1:
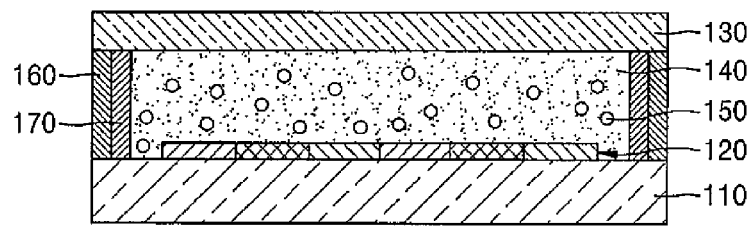
FIG. 1 is a partial cross-sectional view of an organic light-emitting display apparatus according to an exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein . . . etc. . . .

When a certain embodiment may be implemented differently, a specific process order may be performed differently from the described order. For example, two consecutively described processes may be performed substantially at the same time, or may be performed in an order opposite to the described order.

Figure 2:
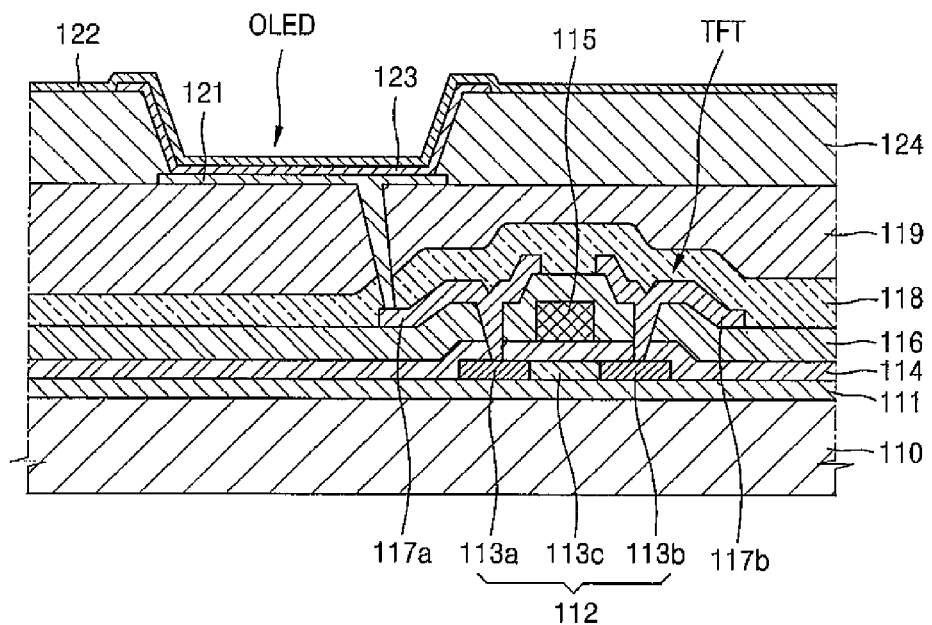
FIG. 2 is a partial cross-sectional view of a display unit of FIG. 1.

FIG. 1 is a partial cross-sectional view of an organic light-emitting display apparatus 100 according to an exemplary embodiment. FIG. 2 is a partial cross-sectional view of a display unit 120 of FIG. 1.

Referring to FIGS. 1 and 2, the organic light-emitting display apparatus 100 may include a substrate 110, the display unit 120, an encapsulating substrate 130, a filling member 140, and light-scattering particles 150.

The substrate 110 includes an insulating material that may be flexible. For example, the substrate 110 may be formed of glass, quartz, or ceramic, or the substrate 110 may be flexible and may be formed of plastic. In more detail, the substrate 110 may be formed of a polymer material, such as polyimide (PI), polycarbonate (PC), polyethersulphone (PES), polyethylene terephthalate (PET), polyethylene naphthalate (PEN), polyarylate (PAR), and fiber glass reinforced plastic (FRP). Also, the substrate 110 may be transparent, semitransparent, and/or non-transparent.

According to the present embodiment, the display unit 120 is formed on the substrate 110. The display unit 120 may include a thin film transistor (TFT), and an organic light-emitting diode (OLED) formed on the TFT.

Referring to FIG. 2, a barrier layer 111 may be formed on the substrate 110. The barrier layer 111 may be formed to cover the entire upper surface of the substrate 110. The barrier layer 111 may include an inorganic layer or an organic layer. The barrier layer 111 may be formed as a single layer, or may be stacked as multiple layers. For example, the barrier layer 111 may be formed of an inorganic material including at least one selected from silicon oxide ($SiO_x$), silicon nitride ($SiN_x$), silicon oxynitride (SiON), aluminum oxide (AlO), and/or aluminum nitride (AlON), and may also be formed of an organic material, such as acryl, polyimide, and/or polyester.

The barrier layer 111 may block oxygen and water from reaching the substrate 110, may prevent water or impurities from spreading through the substrate 110, and may planarize the upper surface of the substrate 110. The TFT may be formed on the barrier layer 111. The TFT is exemplified as a top gate-type TFT in FIG. 2. However, the TFT may have other structures, such as a bottom gate-type TFT.

A semiconductor active layer 112 may be formed on the barrier layer 111, and may include a source area 113a and a drain area 113b by doping edge areas of the semiconductor active layer 112 with N-type or P-type impurities. Between the source area 113a and the drain area 113b, a channel area 113c may be formed without doping the channel area 113c of the semiconductor active layer 112 with impurities.

When the semiconductor active layer 112 is formed of polysilicon, amorphous silicon may be formed and then crystallized to be changed into polysilicon. Also, the semiconductor active layer 112 may be formed of an oxide semiconductor. For example, the oxide semiconductor may include an oxide of a material selected from Groups 4, 12, 13, and 14, metal elements of the periodic table, such as Zn, In, Ga, Sn, Cd, Ge, and Hf, and/or a combination thereof.

A gate insulating layer 114 may be deposited on the semiconductor active layer 112. The gate insulating layer 114 may include an inorganic layer, such as silicon oxide, silicon nitride, and/or metal oxide. The gate insulating layer 114 of FIG. 2 is a single layer, although the gate insulating layer 114 is not limited thereto. For example, the gate insulating layer 114 may be multiple layers.

A gate electrode 115 may be formed on a portion of the gate insulating layer 114. The gate electrode 115 may include a single layer, or may include multiple layers formed of Au, Ag, Cu, Ni, Pt, Pd, Al, Mo, and/or Cr. Alternatively, the gate electrode 115 may include a metal alloy, such as Al:Nd and/or Mo:W.

An interlayer insulating layer 116 may be formed on the gate electrode 115. The interlayer insulating layer 116 may be formed of an insulating material, such as silicon oxide and/or silicon nitride. Also, the interlayer insulating layer 116 may be formed as an insulating organic layer.

A source electrode 117a and a drain electrode 117b may be formed on the interlayer insulating layer 116. In more detail, contact holes may be formed in the gate insulating layer 114 and in the interlayer insulating layer 116 by removing portions of the gate insulating layer 114 and the interlayer insulating layer 116, and through respective ones of the contact holes, the source electrode 117a may be electrically connected to the source area 113a, and the drain electrode 117b may be electrically connected to the drain area 113b.

A passivation layer 118 may be formed on the source electrode 117a and the drain electrode 117b. The passivation layer 118 may be formed as an inorganic layer, such as silicon oxide and/or silicon nitride, or an organic layer.

A planarization layer 119 may be formed on the passivation layer 118. The planarization layer 119 includes an organic layer, such as acryl, polyimide, and/or benzocyclobutene (BCB).

According to an embodiment, the OLED may be formed on the TFT. The OLED includes a first electrode 121, a second electrode 122, and an intermediate layer 123 between the first electrode 121 and the second electrode 122.

The first electrode 121 is electrically connected to any of the source electrode 117a and the drain electrode 117b via a contact hole through the passivation layer 118 and through the planarization layer 119. The first electrode 121 corresponds to a pixel electrode.

According to the present embodiment, the first electrode 121 functions as an anode, and may be formed of various conductive materials. The first electrode 121 may be formed as a transparent electrode or a reflective electrode.

For example, when the first electrode 121 is formed as a transparent electrode, the first electrode 121 may include ITO, IZO, ZnO, and/or $In_2O_3$, etc. When the first electrode 121 is formed as a reflective electrode, a reflective layer may be formed of Ag, Mg, Al, Pt, Pd, Au, Ni, Nd, Ir, Cr, and/or a compound thereof, and ITO, IZO, ZnO, and/or $In_2O_3$, etc. may be formed on the reflective layer.

A pixel-defining layer (PDL) 124 may be formed on the planarization layer 119 to cover an edge(s) of the first electrode 121. The pixel-defining layer 124 defines an emission area of each sub-pixel by surrounding the first electrode 121.

The pixel-defining layer 124 may be formed of an organic material or an inorganic material. For example, the pixel-defining layer 124 may be formed of an organic material, such as polyimide, polyamide, BCB, an acryl resin, and/or a phenol resin, or may be formed of an inorganic material, such as silicon nitride. The pixel-defining layer 124 may be formed as a single layer or multiple layers.

The intermediate layer 123 may be formed on the first electrode 121 in an area that is exposed by etching a portion of the pixel-defining layer 124. The intermediate layer 123 may be formed by deposition.

The intermediate layer 123 may be formed of a low molecular weight organic material or a high molecular weight organic material. The intermediate layer 123 may include an organic emission layer, which may emit a red, green, blue, or white color light. In some embodiments, the intermediate layer 123 may include the organic emission layer, and may further include at least one selected from a hole injection layer (HIL), a hole transport layer (HTL), an electron transport layer (ETL), and/or an electron injection layer (EIL). However, exemplary embodiments are not limited thereto, and the intermediate layer 123 may include the organic emission layer, and may further include other various functional layers.

The second electrode 122 may be formed on the intermediate layer 123. The second electrode 122 may be a common electrode, and may be formed as a transparent electrode or as a reflective electrode, like the first electrode 121.

According to the present embodiment, when the first electrode 121 is formed as a transparent electrode or a reflective electrode, the first electrode 121 may have a shape corresponding to an opening of each sub-pixel. In some embodiments, when the second electrode 122 is formed as a transparent electrode or as a reflective electrode, the transparent electrode or the reflective electrode may be deposited on the entire surface of the display unit 120. Yet in some embodiments, the second electrode 122 may have set patterns (e.g., predetermined patterns), rather than covering the entire surface of the display unit 120. The first electrode 121 and the second electrode 122 may also be stacked in an opposite order than the one shown.

According to an embodiment, the first electrode 121 and the second electrode 122 are insulated from each other by the intermediate layer 123. When a voltage is applied to the first electrode 121 and the second electrode 122, the intermediate layer 123 emits visible rays such that a user may realize the visible rays on a display screen.

The encapsulating substrate 130 may face the substrate 110 and the display unit 120. The encapsulating substrate 130 may encapsulate the display unit 120 to prevent external water or oxygen from penetrating into the display unit 120. Also, the encapsulating substrate 130 may include a plurality of inorganic layers and a plurality of organic layers, which are alternately stacked.

The plurality of inorganic layers may be single layers or stacked layers including metal oxide or metal nitride. For example, the plurality of inorganic layers may include any of $SiN_x$, $Al_2O_3$, $SiO_2$, and/or $TiO_2$.

According to the present embodiment, the plurality of organic layers relieve internal stress of the inorganic layers, compensate for defects of the inorganic layers, and planarize the inorganic layers. Each of the plurality of organic layers may be formed of a polymer. In some embodiments, each of the plurality of organic layers may be a single layer or stacked layers formed of any of polyethylene terephthalate (PET), polyimide (PI), polycarbonate (PC), epoxy, polyethylene, and/or polyacrylate (PAR).

The filling member 140 may be between the display unit 120 and the encapsulating substrate 130. The filling member 140 may fill an area defined by the sealant 160 and a getter 170. In some embodiments, the filling member 140 may form a thin layer between the substrate 110 and the encapsulating substrate 130, in order to absorb external shock applied to the organic light-emitting display apparatus 100.

In some embodiments, the filling member 140 may be formed of silicone. In more detail, the filling member 140 may include polydimethylsiloxane. The filling member 140 may be formed of a material having a refractive index of about 1.41 to about 1.54, and may be in a liquid state or in a solid state.

Next, the light-scattering particles 150 may include at least one selected from methyl silicone, phenyl silicone, and/or polystyrene. Here, the light-scattering particles 150 formed of methyl silicone or phenyl silicone may have a refractive index of about 1.41 to about 1.54, and the light-scattering particles 150 formed of polystyrene may have a refractive index of about 1.58 to about 1.60. In more detail, the light-scattering particles 150 formed of methyl silicone may have a refractive index of approximately 1.41, and the light-scattering particles 150 formed of phenyl silicone may have a refractive index of approximately 1.54.

A difference between the refractive index of the filling member 140 and the refractive index of the light-scattering particles 150 may be about 0.1 to about 0.2, and either one of the refractive index of the filling member 140 and the refractive index of the light-scattering particles 150 may be greater or less than the other. For example, when the filling member 140 having a refractive index of about 1.41 is used, the light-scattering particles 150 having a refractive index of about 1.21 to about 1.31 or about 1.51 to about 1.61 may be selected to be distributed in the filling member 140. In this case, the light-scattering particles 150 formed of phenyl silicone having a refractive index of about 1.51 to about 1.54, or polystyrene having a refractive index of about 1.58 to about 1.60 may be selected.

When the filling member 140 having a refractive index of about 1.54 is used, the light-scattering particles 150 having a refractive index of about 1.34 to about 1.44 or about 1.64 to about 1.74 may be selected to be distributed in the filling member 140. In this case, the light-scattering particles 150 may be formed of methyl silicone having a refractive index of about 1.41 to about 1.44.

According to an exemplary embodiment, when the light-scattering particles 150 are formed of polystyrene, the content of the light-scattering particles 150 in the filling member 140 may be selected between about 2 to about 3 wt %, and an average particle diameter ($D_{50}$) of the light-scattering particles 150 may be 1.5 μm.

According to the present embodiment, the filling member 140 and the light-scattering particles 150 may be formed of a thermosetting, a photocurable, and/or a hybrid curing material. Also, because the filling member 140 and the light-scattering particles 150, which are formed of the same material, have excellent distribution properties, the filling member 140 and the light-scattering particles 150 have less sinking weight, which makes performing a process of forming the filling member 140 and the light-scattering particles relatively easy.

In some embodiments, a process of applying the light-scattering particles 150 in the filling member 140 is performed in a dry condition. If the light-scattering particles 150 have a high rate of water absorption, or if the process is performed in an environment having a high humidity, the display device may be affected, and dark sports may be generated. Thus, according to the present embodiment, the light-scattering particles 150 have a rate of water absorption that is less than 1%, when the light-scattering particles 150 are exposed to a 95% relative humidity environment for four hours. Also, in some embodiments, a glass transition temperature of the light-scattering particles 150 is equal to or less than about 0° C., and a compressive strength of the light-scattering particles 150 is equal to or less than about 10 kg/mm$^2$.

The organic light-emitting display apparatus 100 may further include the sealant 160 between the substrate 110 and the encapsulating substrate 130 at an edge portion thereof, the sealant 160 effectively bonding the substrate 110 and the encapsulating substrate 130. Also, a getter 170, which absorbs water flowing into the organic light-emitting display apparatus 100, may be formed inside the sealant 160 (e.g., adjacent the sealant 160 on an inner side of the sealant 160).

According to an embodiment, a rate of improvement of a white angular difference (WAD), and a rate of luminance deterioration of the organic light-emitting display apparatus 100 formed of the filling member 140 and the light-scattering particles 150 described above, will be described by referring to FIG. 3 and Table 1.

Figure 3:
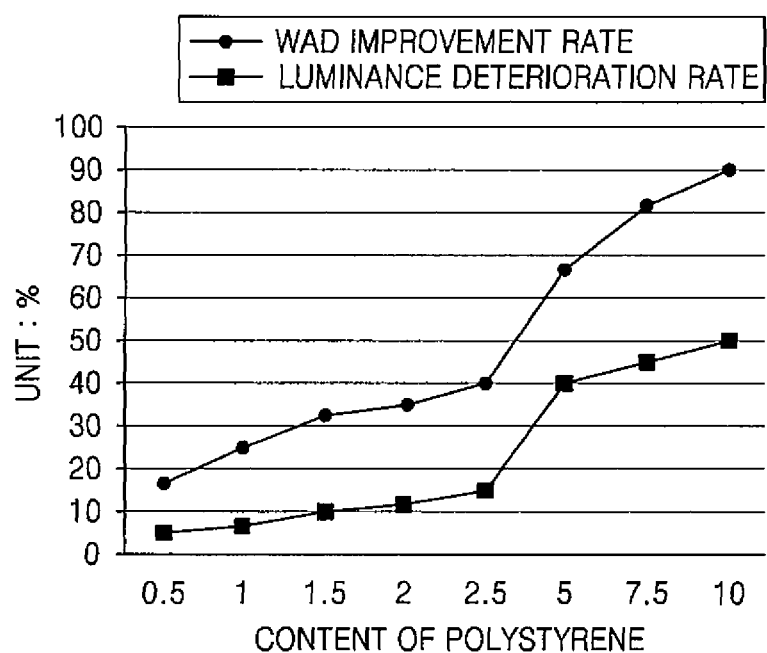
FIG. 3 is a graph showing a rate of improvement of a white angular difference (WAD) and a rate of luminance deterioration, according to a content of polystyrene.

FIG. 3 is a graph showing the rate of improvement of the WAD (i.e., WAD IMPROVEMENT RATE) and the rate of luminance deterioration (i.e., LUMINANCE DETERIORATION RATE) according to a content of polystyrene.

Here, the WAD refers to an item that evaluates a change in a characteristic of a white color light, depending on an angle at which the color light of the organic light-emitting display apparatus 100 is seen. The WAD is an index for identifying a rate of improvement of a wide viewing angle (e.g., over a conventional display apparatus). In more detail, by referring to the WAD, identification of improvements in luminance and color coordinates according to a change in observation angle with respect to a front view (e.g., a viewing angle that is normal to a display screen), and as compared to an organic light-emitting display apparatus 100 omitting the filling member 140 and the light-scattering particles 150 of the exemplary embodiment. Also, the luminance deterioration rate is an index for indicating how luminance deteriorates when observed from a changed angle as compared to luminance observed from the front view of the display.

Here, as the WAD improvement rate increases, luminance and quality of color coordinates when seen from a side angle of the display (as opposed to being seen from the front of the display) decreases. Also, as the luminance deterioration rate decreases, it is more likely that the luminance seen from the side angle of the display has the same, or substantially the same, value as when seen from the front view of the display.

Here, the axis X denotes a content of the light-scattering particles 150 formed of polystyrene, and the axis Y denotes the WAD improvement rate and the luminance deterioration rate.

Hereinafter, Table 1 shows the WAD improvement rate and the luminance deterioration rate, which is measured by distributing polystyrene, which can have various contents as the light-scattering particles 150 in the filling member 140 when the filling member 140 is formed of polydimethylsiloxane having a refractive index of about 1.41 to about 1.54.

TABLE 1

| Content of polystyrene (wt %) | WAD improvement rate (%) | Luminance deterioration rate (%) |
|---|---|---|
| 10 | 90 | 50 |
| 7.5 | 82 | 45 |
| 5.0 | 67 | 40 |
| 2.5 | 40 | 15 |
| 2.0 | 35 | 12 |
| 1.5 | 32 | 10 |
| 1.0 | 25 | 7 |
| 0.5 | 17 | 5 |

Referring to FIG. 3 and Table 1, as the content of polystyrene increases, the WAD improvement rate increases, but the rate of luminance of deterioration also increases. Thus, in some embodiments, the content of polystyrene, which may achieve both a high WAD improvement rate and an appropriate luminance deterioration rate, is selected. The organic light-emitting display apparatus 100 of the present embodiment may include the light-scattering particles 150 formed of polystyrene having the content of about 2 to about 3 wt %.

In more detail, when the light-scattering particles 150 are formed of polystyrene having the content of about 2.5 wt %, a luminance deterioration rate of about 15%, and a WAD improvement rate of about 40%, may be obtained. The numbers above may be obtained by repetitive experiments. However, the organic light-emitting display apparatus 100 of other embodiments of the present invention is not limited to thereto, and may have a different WAD improvement rate and/or a different luminance deterioration rate, according to a material, a refractive index, and a content of the light-scattering particles 150.

Although FIG. 3 and Table 1 describe the organic light-emitting display apparatus 100 including the filling member 140 formed of polydimethylsiloxane, and the light-scattering particles 150 formed of polystyrene, exemplary embodiments are not limited thereto. That is, the effects shown in FIG. 3 and Table 1 (or similar effects) may be obtained by using the light-scattering particles 150 including methyl silicone or phenyl silicone described above.

Also, the light-scattering particles 150 may be formed of one selected from methyl silicone, phenyl silicone, and polystyrene, two selected from methyl silicone, phenyl silicone, and polystyrene, or three selected from methyl silicone, phenyl silicone, and polystyrene. As long as the light-scattering particles 150 are formed such that a difference between the refractive index of the filling member 140 and the refractive index of the light-scattering particles 150 is within about 0.1 to about 0.2, the light-scattering particles 150 may have any material or content.

Figure 4:
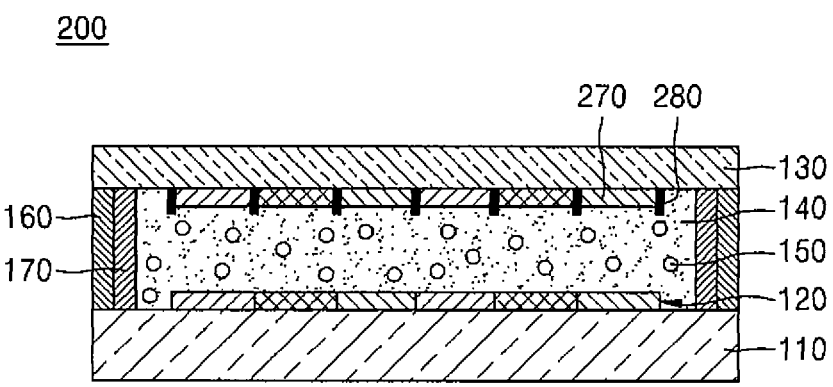
FIG. 4 is a partial cross-sectional view of an organic light-emitting display apparatus, according to another exemplary embodiment.

FIG. 4 is a partial cross-sectional view of an organic light-emitting display apparatus 200 according to another exemplary embodiment.

Referring to FIG. 4, the organic light-emitting display apparatus 200 of another embodiment of the present invention may further include a color filter 270 and a black matrix 280, in addition to the components of the organic light-emitting display apparatus 100 of FIG. 1.

The color filter 270 is formed on the encapsulating substrate 130, and on an area of the encapsulating substrate 130, which corresponds to the intermediate layer 123 of the display unit 120. The color filter 270 may include pigments that may emit various colors, such as red, blue, green, and/or white, which may correspond to light emitted from the organic emission layer of the intermediate layer 123. The pigments determine the color that is displayed by the color filter 270.

The black matrix 280 is formed between respective ones of a plurality of color filters 270, and may absorb or reflect visible rays. The black matrix 280 may block light that flows into the organic light-emitting display apparatus 100 and that is again reflected to the outside. The color filter 270 formed between a plurality of black matrices 280 may effectively transmit the light emitted by the organic emission layer of the intermediate layer 123 to the outside.

A substrate 210, a display unit 220, an encapsulating substrate 230, a filling member 240, light-scattering particles 250, a sealant 160, and a getter 170 as shown in FIG. 4 are substantially the same as the substrate 110, the display unit 120, the encapsulating substrate 130, the filling member 140, the light-scattering particles 150, the sealant 160, and the getter 170 of FIGS. 1 and 2, and thus, detailed descriptions thereof will be omitted.

As described above, according to the one or more of the above exemplary embodiments, the organic light-emitting display apparatus has a structure in which the filling member, and light-scattering particles having a different refractive index from the filling member are interposed between the substrate and the encapsulating substrate, and thus, a wide viewing angle of the organic light-emitting display apparatus may be improved and a luminance deterioration rate may be decreased at the same time.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. An organic light-emitting display apparatus comprising:
   a substrate;
   a display unit on the substrate;
   an encapsulating substrate facing the substrate and the display unit;
   a filling member between the display unit and the encapsulating substrate; and
   light-scattering particles in the filling member,
   wherein the light-scattering particles comprise polystyrene and at least one of methyl silicone or phenyl silicone, a refractive index of the polystyrene being from 1.58 to 1.60,
   wherein a content of the light-scattering particles in the filling member is from 2 to 3 wt %, and
   wherein a difference between a refractive index of the filling member and a refractive index of the light-scattering particles is from 0.1 to 0.2.

2. The organic light-emitting display apparatus of claim 1, wherein the filling member comprises silicone.

3. The organic light-emitting display apparatus of claim 1, wherein the filling member comprises polydimethylsiloxane (PDMS).

4. The organic light-emitting display apparatus of claim 1, wherein the refractive index of the filling member is from 1.41 to 1.54.

5. The organic light-emitting display apparatus of claim 1, wherein a refractive index of methyl silicone or phenyl silicone is from 1.41 to 1.54.

6. The organic light-emitting display apparatus of claim 1, wherein an average particle diameter ($D_{50}$) of the light-scattering particles is 1.5 μm.

7. The organic light-emitting display apparatus of claim 1, further comprising a sealant between the substrate and the encapsulating substrate at an edge thereof, the sealant bonding the substrate and the encapsulating substrate together.

8. The organic light-emitting display apparatus of claim 7, further comprising a getter adjacent the sealant for absorbing moisture.

9. The organic light-emitting display apparatus of claim 1, wherein the display unit comprises a thin film transistor and an organic light-emitting diode.

10. The organic light-emitting display apparatus of claim 9, wherein the organic light-emitting diode comprises a first electrode, a second electrode, and an intermediate layer between the first electrode and the second electrode.

11. The organic light-emitting display apparatus of claim 10, further comprising a plurality of color filters on a respective area of the encapsulating substrate corresponding to the intermediate layer.

12. The organic light-emitting display apparatus of claim 11, further comprising a black matrix between respective color filters of the plurality of color filters for absorbing visible light.

\* \* \* \* \*